United States Patent
Hasegawa et al.

(10) Patent No.: US 10,669,614 B2
(45) Date of Patent: Jun. 2, 2020

(54) SPUTTERING TARGET MATERIAL

(71) Applicant: Sanyo Special Steel Co., Ltd., Himeji-shi (JP)

(72) Inventors: Hiroyuki Hasegawa, Himeji (JP); Yumeki Shinmura, Himeji (JP)

(73) Assignee: Sanyo Special Steel Co., Ltd., Hyogo (JP)

( * ) Notice: Subject to any disclaimer, the term of this patent is extended or adjusted under 35 U.S.C. 154(b) by 33 days.

(21) Appl. No.: 16/303,788

(22) PCT Filed: May 22, 2017

(86) PCT No.: PCT/JP2017/019023
§ 371 (c)(1),
(2) Date: Nov. 21, 2018

(87) PCT Pub. No.: WO2017/204158
PCT Pub. Date: Nov. 30, 2017

(65) Prior Publication Data
US 2019/0309394 A1    Oct. 10, 2019

(30) Foreign Application Priority Data
May 25, 2016 (JP) ................ 2016-103902

(51) Int. Cl.
C22C 19/03    (2006.01)
C23C 14/34    (2006.01)
G11B 5/73     (2006.01)
G11B 5/851    (2006.01)
B22F 1/00     (2006.01)

(52) U.S. Cl.
CPC .............. C22C 19/03 (2013.01); C23C 14/34 (2013.01); G11B 5/73 (2013.01); G11B 5/851 (2013.01); *B22F 1/00* (2013.01)

(58) Field of Classification Search
CPC ................................ C22C 19/03; C23C 14/34
See application file for complete search history.

(56) References Cited

U.S. PATENT DOCUMENTS 7,828,913 B1    11/2010  Huddleston
2007/0153419 A1  7/2007  Arai et al.

FOREIGN PATENT DOCUMENTS

| JP | 2000206314 A | 7/2000 |
| JP | 4499044 B2   | 7/2010 |
| JP | 2013127111 A | 6/2013 |

*Primary Examiner* — Jessee R Roe
(74) *Attorney, Agent, or Firm* — The Webb Law Firm

(57) ABSTRACT

A sputtering target material, wherein the strength of a sputtering target material can be enhanced without using pure Ta to prevent cracking during sputtering and generating particles and to suppress an irregular composition of a sputtered film, is provided. The present invention provides a sputtering target material containing, in at %, 35% to 50% of Ta with the balance being Ni and an inevitable impurity, wherein the sputtering target is composed only of a $Ni_2Ta$ compound phase and a NiTa compound phase, and a microstructure in each of the $Ni_2Ta$ compound phase and the NiTa compound phase has a maximum inscribed circle diameter of not more than 10 μm.

2 Claims, 1 Drawing Sheet

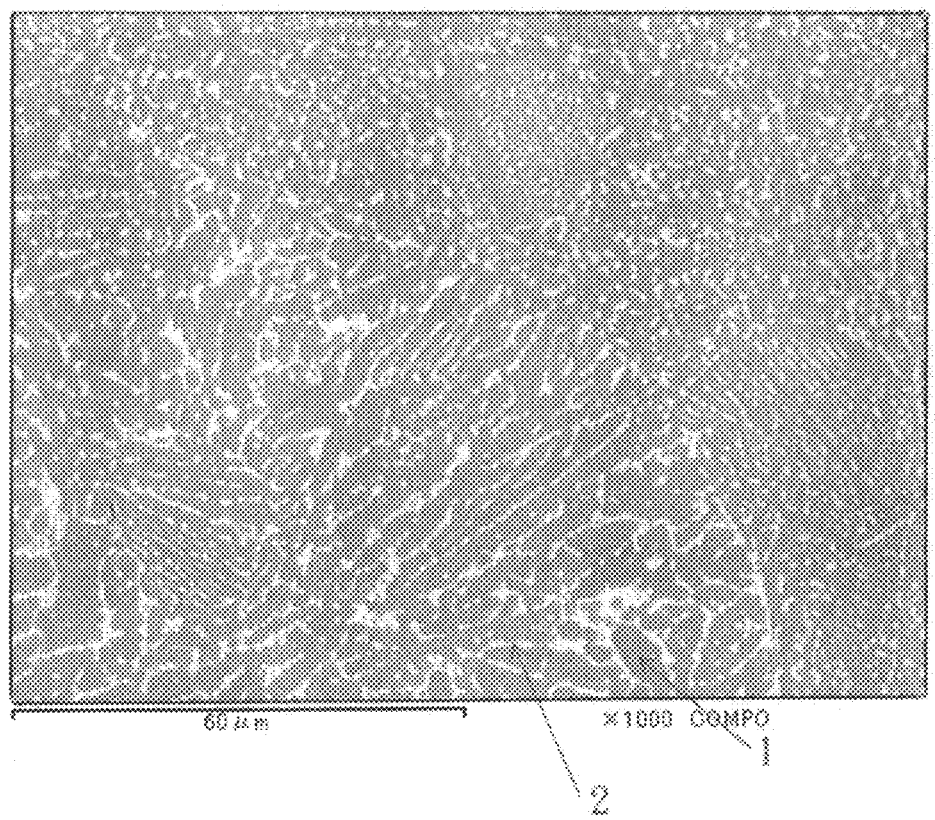

SPUTTERING TARGET MATERIAL

CROSS-REFERENCE TO RELATED APPLICATIONS

This application is the United States national phase of International Application No. PCT/JP2017/019023 filed May 22, 2017, and claims priority to Japanese Patent Application No. 2016-103902 filed May 25, 2016, the disclosures of which are hereby incorporated in their entirety by reference.

BACKGROUND OF THE INVENTION

Field of the Invention

The present invention relates to a sputtering target material for a soft magnetic thin film layer in a perpendicular magnetic recording medium.

Background Art

Recently, the advance of magnetic recording technology has been remarkable, and increasing the recording density of magnetic recording media is proceeding, and a perpendicular magnetic recording system in which further higher recording density than longitudinal magnetic recording media which was in widespread use can be therefore realized has been in use. A perpendicular magnetic recording system refers to a method, being suitable for achieving high recording density, in which an easy axis is formed so as to orient perpendicularly to media surface in a magnetic film of a perpendicular magnetic recording medium.

For example, as described in JP-4499044-B2 (Patent Document 1), a perpendicular magnetic recording medium is known in which an adhesion layer, a soft magnetic layer, a seed layer, an intermediate layer, a magnetic recording layer and a protective layer are laminated in this order, the soft magnetic layer having a Co alloy, the seed layer having a first seed layer at the soft magnetic layer side and a second seed layer at the intermediate layer side, the first seed layer being composed of an amorphous alloy containing Cr and one or more elements selected from Ta, Ti, Nb, Si and Al, the second seed layer being composed of a crystalline alloy containing Ni and one or more elements selected from Cr, Ta, Ti, Nb, V, W, Mo and Cu.

Ni—Ta sputtering target material as described in JP-2013-127111-A (Patent Document 2) is used as a target which is used for forming the above-mentioned adhesion layer. In the sputtering target material described in this Patent Document 2, by containing NiTa compound phase and pure Ta phase in the sputtering target material, the strength of the sputtering target material is enhanced to reduce cracking during targeting and generating particles.

PRIOR ART DOCUMENTS

Patent Documents

Patent Document 1: JP-4499044-B2
Patent Document 2: JP-2013-127111-A

SUMMARY OF THE INVENTION

Problems to be Solved by the Invention

In the above-mentioned sputtering target material of Patent Document 2, the strength of the sputtering target material is enhanced to reduce cracking during targeting and generating particles by containing pure Ta phase, and therefore, the strength of the sputtering target material is enhanced by utilizing pure Ta powders. However, there has been a drawback in which, a large change of a composition in a microstructure of such sputtering target materials may occur because of the presence of a pure Ta phase in the sputtering target material, which results in an irregular composition of a sputtered film reflecting the composition change.

Therefore, it is an objective of the present invention to provide a sputtering target material, wherein the strength of a sputtering target material can be enhanced without using pure Ta powders to prevent cracking during sputtering and generating particles and to suppress an irregular composition of a sputtered film.

Solution to the Problems

In order to solve the above problems, the inventors found as a result of advanced intensive development a sputtering target material, wherein the strength of a sputtering target material can be enhanced without using pure Ta to prevent cracking during sputtering and generating particles and to suppress an irregular composition of a sputtered film. In other words, in the present invention, the strength of a sputtering target material is allowed to be enhanced, without utilizing pure Ta powders, by controlling a microstructure of the sputtering target material in contrast to the fact that the strength of a sputtering target material is conventionally enhanced by utilizing pure Ta powders.

Therefore, the present invention encompasses the following sputtering target materials:

[1] A sputtering target material, comprising, in at %, 35% to 50% of Ta with the balance being Ni and an inevitable impurity, wherein the sputtering target material is composed only of a $Ni_2Ta$ compound phase and a NiTa compound phase, and wherein a microstructure in each of the $Ni_2Ta$ compound phase and the NiTa compound phase has a maximum inscribed circle diameter of not more than 10 μm.

[2] The sputtering target material according to [1], wherein the sputtering target material has a bending strength of not less than 450 MPa.

Effects of the Invention

As described above, the present invention provides a Ni—Ta sputtering target material which has strength so that cracking during sputtering and generating particles can be prevented and also an irregular composition of a sputtered film can be suppressed by dispersing finely $Ni_2Ta$ compound and NiTa compound phases in a microstructure of a sputtering target material containing Ni as a main component and Ta in a limited range of 35% to 50%.

BRIEF DESCRIPTION OF THE DRAWING

FIG. 1 is a micrograph, observed by an electron scanning microscope (SEM), of a microstructure of a sputtering target material according to the present invention.

DETAILED DESCRIPTION OF THE INVENTION

The present invention will be described in detail below.
The sputtering target material according to the present invention contains, in at %, 35% to 50% of Ta with the balance being Ni and an inevitable impurity. On the other hand, when Ta is less than 35% or more than 50%, only either one of $Ni_2Ta$ and NiTa compounds is formed. In other words, the equilibrium diagram shows that a phase which is formed between 100% Ni and Ni-35Ta (exclusive) is Ni, $Ni_8Ta$, $Ni_3Ta$, and/or $Ni_2Ta$, a phase which is formed between Ni-50Ta (exclusive) and 100% Ta is NiTa, $NiTa_2$, and/or Ta, and $Ni_2Ta$ and NiTa can coexist only between Ni-35Ta and Ni-50Ta.

FIG. 1 is a micrograph, observed by an electron scanning microscope (SEM), of a microstructure of a sputtering target material according to the present invention. In the FIGURE, Sign 1 represents a $Ni_2Ta$ compound phase (gray) and Sign 2 represents a NiTa compound phase (white), and it is seen that the microstructure of the sputtering target material is composed only of two phases, which are a $Ni_2Ta$ compound phase and a NiTa compound phase. In the present invention, formation of a fine phase such that a microstructure in each of the $Ni_2Ta$ compound phase and the NiTa compound phase has a maximum inscribed circle diameter of not more than 10 μm is characteristic. By allowing a microstructure of the sputtering target material to have such phases, the strength of the sputtering target material can be enhanced to suppress generating particles during sputtering and to prevent an irregular composition of a sputtered film due to an irregular composition in the sputtering target material.

Since an atomized powder is used for a component composition limited to the range of 35 to 50% of Ta with the balance being Ni as described above, the phase formed is composed of only $Ni_2Ta$ compound phase and NiTa compound phase. In the other words, both $Ni_2Ta$ compound phase and NiTa compound phase coexist, and therefore a phase other than the two phases does not exist. By allowing a microstructure of the sputtering target material to have such phases, the strength of the sputtering target material can be enhanced to suppress generating particles during sputtering and to prevent an irregular composition of a sputtered film due to an irregular composition in the sputtering target material.

Moreover, by allowing a molding temperature to be 1000° C. to 1200° C. and a molding pressure to be 100 to 150 MPa, a fine structure is achieved. On the other hand, when the molding temperature is less than 1000° C. and the molding pressure is less than 100 MPa, an intended fine structure cannot be sufficiently achieved. In addition, when the molding temperature is higher than 1200° C. and the molding pressure is more than 150 MPa, the inscribed circle diameter of the microstructure in each of the $Ni_2Ta$ compound phase and the NiTa compound phase cannot be achieved to be not more than 10 μm. Therefore, it is preferred that the molding temperature be 1000° C. to 1200° C. and the molding pressure be 100 to 150 MPa.

As described above, in the present invention, it is possible to provide a sputtering target material such that the strength of the sputtering target material can be enhanced and also that cracking during sputtering, generating particles and an irregular composition of a sputtered film can be prevented, by such a way that only both $Ni_2Ta$ compound phase and the NiTa compound phase coexist as a constituent phase without using pure Ta and that the microstructure is allowed to be such a fine structure that the inscribed circle diameter of the microstructure in each of the $Ni_2Ta$ compound phase and the NiTa compound phase is not more than 10 μm.

As a rapid cooling solidification method applied for producing the sputtering target material according to the present invention, a gas atomization process in which less impurity is contaminated and a spherical powder suitable for sintering because of its high packing ratio can be obtained is preferred. As a pressure sintering method for the powder, methods such as hot press, hot isostatic pressing, electric pressure sintering and hot extrusion can be applied. Among these, hot isostatic pressing is especially preferred by reason that its pressing pressure is high and that a dense sintered compact is obtained even though coarsening of an intermetallic compound phase is suppressed restricting a maximum temperature to low.

Note that both melting casting method and powder sintering method can be applied for the sputtering target material according to the present invention as long as a microstructure thereof can be controlled. Note that it is desirable that a solidification rate be faster than that of general castings in which, for example, molten alloy is cast into a mold cooled by water cooling or the like in order to control the maximum inscribed circle diameter of the microstructure in each of the $Ni_2Ta$ compound phase and the NiTa compound phase to be not more than 10 μm in the microstructure when a melting casting method is applied.

It is preferred that the sputtering target material according to the present invention have a bending strength of not less than 450 MPa. The bending strength of the sputtering target material according to the present invention is, for example, not less than 500 MPa and not more than 750 MPa. Note that the bending strength is measured as follows: A specimen of 4 mm wide, 3 mm high and 25 mm long which is cut away from a sintered alloy by a wire is evaluated by three-point bending test, and the obtained result is defined as a three-point bending strength. A three-point bending test is carried out in such a way that a rolling reduction is applied with a distance between support points of 20 mm and a stress (N) at the time is then measured and a three-point bending strength is calculated according to the following formula:

A three-point bending strength (MPa)=(3×stress (N)×a distance between support points (mm)/(2×a specimen width (mm)×(a specimen thickness $(mm)^2$)

EXAMPLES

The present invention will be described more specifically with examples below.

Ni—Ta alloy powders were produced from respective component composition shown in Table 1 by a gas atomization process. The obtained powders were classified to not more than 500 μm, and used as raw material powders for HIP molding (hot isostatic pressing). A billet for HIP molding was produced by such a way that a raw material powder is filled into a carbon steel can of 50 mm long with 250 mm in diameter, then degassed in vacuum and mounted. This powder billet was HIP-molded in a condition of molding pressure, molding temperature and retention time shown in Table 1. Thereafter, a sputtering target material of 7 mm thick with 180 mm in diameter was produced from the compact.

For the evaluation, a microstructure of a sputtering target material was evaluated for the maximum inscribed circle being able to be drawn in the compound by taking a specimen for an electron scanning microscope (SEM) from the sputtering target material listing, polishing the cross section of the specimen and taking a backscattered electron image. The specimen was analyzed along a line of 1 mm long at five measurement positions using an Electron Probe Micro Analyzer, and the difference of the maximum and minimum values of Ni atomic weight was then evaluated. When the maximum and minimum values of Ni atomic weight are not more than 20 at %, it shall be OK as a sputtering target material having good homogeneity. When the difference of the maximum and minimum values of Ni atomic weight are not less than 20 at %, it shall be NG.

For evaluating for particles, the sputtering target material sample was deposited on an aluminum substrate of 1.75 mm thick with 95 mm in diameter under Ar gas pressure of 0.9 Pa using a DC magnetron sputter, and the amount of particles was then evaluated using Optical Surface Analyzer.

For evaluating for an irregular composition of sputtered film, the sputtered substrate was analyzed along a line of 1 mm long at five measurement positions using an Electron Probe Micro Analyzer, and the difference of the maximum and minimum values of Ni atomic weight was then evaluated. When the maximum and minimum values of Ni atomic weight are not more than 20 at %, it shall be OK as a film having good homogeneity. When the maximum and minimum values of Ni atomic weight are not less than 20 at %, it shall be NG.

For evaluating the strength of the sputtering target material, a specimen of 4 mm wide, 3 mm high and 25 mm long was cut away from TP by a wire, and then evaluated by three-point bending test. A three-point bending test is carried out in a condition that a rolling reduction is applied with a distance between support points of 20 mm and a stress (N) at the time is then measured and a three-point bending strength is calculated according to the following formula:

$$A\text{ three-point bending strength }(MPa)=(3\times\text{stress }(N)\times a\text{ distance between support points }(mm)/2\times a\text{ specimen width }(mm)\times(a\text{ specimen thickness }(mm)^2)$$

As shown in Table 1, No. 1 to 12 are Inventive Examples and No. 13 to 18 are Comparative Examples.

In Comparative Example No. 13, Ta component composition is high and uniformly NiTa compound phase. In the other words, $Ni_2Ta$ is not present, and stiffness is therefore very low because the component composition is wholly NiTa compound phase. A lot of particles are generated because of low stiffness. In Comparative Example No. 14, the maximum inscribed circle diameter of the microstructure of the $Ni_2Ta$ compound phase is coarsened to be 16 μm, and the stiffness is therefore low. A lot of particles are therefore generated. In Comparative Example No. 15, Ta component composition is low and uniformly $Ni_2Ta$ compound phase. In the other words, NiTa compound phase is not present, and stiffness is therefore very low because the component composition is wholly $Ni_2Ta$ compound phase. A lot of particles are therefore generated.

Comparative Example No. 16 was produced by such a way that pure Ta powder, Ni-37.5Ta atomized powder and pure Ni atomized powder were mixed with mixing ratio of 41.33:33.1:25.57 for 30 minutes using a V-type mixer, filled into a carbon steel can of 50 mm long with 250 mm in diameter, then degassed in vacuum and mounted. This powder billet was HIP-molded in a condition of molding pressure, molding temperature and retention time shown in Table 1. Thereafter, a sputtering target material of 7 mm thick with 180 mm in diameter was produced from the compact. The maximum inscribed circle diameter of the microstructure of the NiTa compound phase is coarsened to be 15, and also Ta phase, $Ni_3Ta$ phase and Ni phase exist

TABLE 1

| No | Component composition (at %) Ta | Ni | Molding temperature (° C.) | Molding pressure (MPa) | Retention time (Hr) | Inscribed circle drawn in $Ni_2Ta$ compound phase (μm) | Inscribed circle drawn in NiTa compound phase (μm) | Uniformity of target | Bending strength of target (MPa) | Number of particles | Uniformity of sputtered film | Note |
|---|---|---|---|---|---|---|---|---|---|---|---|---|
| 1 | 35.4 | Balance | 1100 | 100 | 3 | 4 | 3 | OK | 730 | 2 | OK | Inventive Example |
| 2 | 37.5 | Balance | 1170 | 150 | 5 | 3 | 2 | OK | 700 | 1 | OK | |
| 3 | 40.0 | Balance | 1150 | 130 | 2 | 3 | 3 | OK | 720 | 1 | OK | |
| 4 | 45.0 | Balance | 1000 | 110 | 5 | 3 | 4 | OK | 500 | 2 | OK | |
| 5 | 48.9 | Balance | 1200 | 100 | 8 | 3 | 4 | OK | 600 | 1 | OK | |
| 6 | 35.0 | Balance | 1000 | 130 | 3 | 7 | 2 | OK | 650 | 1 | OK | |
| 7 | 36.0 | Balance | 1140 | 130 | 3 | 4 | 3 | OK | 630 | 0 | OK | |
| 8 | 38.0 | Balance | 1130 | 150 | 5 | 3 | 3 | OK | 720 | 2 | OK | |
| 9 | 42.0 | Balance | 1120 | 150 | 5 | 4 | 3 | OK | 730 | 2 | OK | |
| 10 | 43.0 | Balance | 1180 | 150 | 5 | 4 | 4 | OK | 680 | 2 | OK | |
| 11 | 47.0 | Balance | 1170 | 140 | 5 | 3 | 5 | OK | 690 | 1 | OK | |
| 12 | 50.0 | Balance | 1190 | 140 | 5 | 3 | 7 | OK | 700 | 1 | OK | |
| 13 | <u>52.0</u> | Balance | <u>1340</u> | 160 | 10 | $Ni_2Ta$ does not exist | <u>Wholly NiTa compound phase</u> | OK | 200 | 23 | OK | Comparative Example |
| 14 | 37.5 | Balance | <u>1340</u> | 160 | 10 | <u>16</u> | 8 | OK | 200 | 19 | OK | |
| 15 | <u>34.0</u> | Balance | <u>1340</u> | 130 | 10 | Wholly $Ni_2Ta$ compound phase | <u>NiTa does not exist</u> | OK | 200 | 19 | OK | |
| 16 | 35.4 | Balance | 1150 | 150 | 3 | <u>15</u> | <u>15</u> | NG | 430 | 5 | NG | |
| 17 | 41.7 | Balance | 1150 | 130 | 3 | 5 | <u>13</u> | NG | 380 | 5 | NG | |
| 18 | 37.5 | Balance | 1150 | 100 | 3 | <u>13</u> | 10 | NG | 400 | 3 | NG | |

Note 1)
Underline means not being within the present invention.

Note 2)
Each Comparative Example 16, 17 and 18 is a target component composition composed of a mixture of a pure Ta powder, Ni37.5Ta atomized powder and pure Ni atomized powder obtained by changing a mixing weight ratio.

other than Ni$_2$Ta compound phase and NiTa compound phase, and the stiffness is therefore low. A lot of particles are therefore generated.

Comparative Example No. 17 was produced by such a way that pure Ta powder and Ni-37.5Ta atomized powder were mixed with mixing ratio of 11.09:88.91 for 30 minutes using a V-type mixer in the same manner as No. 16, filled into a carbon steel can of 50 mm long with 250 mm in diameter, then degassed in vacuum and mounted. This powder billet was HIP-molded in a condition of molding pressure, molding temperature and retention time shown in Table 1. Thereafter, a sputtering target material of 7 mm thick with 180 mm in diameter was produced from the compact. The maximum inscribed circle diameter of the microstructure of the NiTa compound phase of the target material is coarsened to be 13 μm, and also Ta phase exist other than Ni$_2$Ta compound phase and NiTa compound phase, the stiffness is therefore low though it is improved better than Comparative Example 16, and the particles are therefore generated. In addition, it contains pure Ta, and its composition is ununiform as a sputtering target material, and the sputtered film has an irregular composition.

Comparative Example No. 18 was produced by such a way that pure Ta powder and pure Ni atomized powder were mixed with mixing ratio of 64.91:35.09 for 30 minutes using a V-type mixer in the same manner as No. 16, filled into a carbon steel can of 50 mm long with 250 mm in diameter, then degassed in vacuum and mounted. This powder billet was HIP-molded in a condition of molding pressure, molding temperature and retention time shown in Table 1. Thereafter, a sputtering target material of 7 mm thick with 180 mm in diameter was produced from the compact. The maximum inscribed circle diameter of the microstructure of the Ni$_2$Ta compound phase of the target material is coarsened to be 13 μm, and also Ta phase, Ni$_3$Ta phase and Ni phase exist other than Ni$_2$Ta compound phase and NiTa compound phase, the stiffness is therefore low though it is improved better than Comparative Example 16, and the particles are therefore generated. In addition, it contains pure Ta and Ni$_3$Ta phases, and its composition is ununiform as a sputtering target material, and the sputtered film has an irregular composition.

The invention claimed is:

1. A sputtering target material, comprising, in at %, 35% to 50% of Ta with the balance being Ni and an inevitable impurity,
wherein the sputtering target material is composed only of a Ni$_2$Ta compound phase and a NiTa compound phase, and
wherein a microstructure in each of the Ni$_2$Ta compound phase and the NiTa compound phase has a maximum inscribed circle diameter of not more than 10 μm.

2. The sputtering target material according to claim 1, wherein the sputtering target material has a bending strength of not less than 450 MPa.

\* \* \* \* \*